United States Patent
Shearman et al.

(10) Patent No.: US 11,102,914 B2
(45) Date of Patent: Aug. 24, 2021

(54) HYBRID CONTROL AND COOLING MODULE WITH INDEPENDENTLY REMOVABLE COOLING SECTION FOR A NETWORK DEVICE

(71) Applicant: Ciena Corporation, Hanover, MD (US)

(72) Inventors: Simon John Shearman, Almonte (CA); Anthony Mayenburg, Carp (CA); Michael Bishop, Nepean (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/903,724

(22) Filed: Jun. 17, 2020

(65) Prior Publication Data

US 2020/0315067 A1  Oct. 1, 2020

Related U.S. Application Data

(63) Continuation of application No. 16/255,301, filed on Jan. 23, 2019, now Pat. No. 10,729,037.

(51) Int. Cl.
*H05K 7/20* (2006.01)
*H04Q 1/02* (2006.01)
*H05K 7/14* (2006.01)

(52) U.S. Cl.
CPC ......... *H05K 7/20581* (2013.01); *H04Q 1/035* (2013.01); *H05K 7/1411* (2013.01); *H05K 7/1438* (2013.01); *H05K 7/20172* (2013.01); *H05K 7/20727* (2013.01)

(58) Field of Classification Search
CPC .............. H05K 7/1411; H05K 7/1438; H05K 7/20172; H05K 7/20581; H05K 7/20727; H04Q 1/035
See application file for complete search history.

(56) References Cited

U.S. PATENT DOCUMENTS

| | | | |
|---|---|---|---|
| 6,735,081 B1 | 5/2004 | Bishop et al. | |
| 6,914,784 B1 * | 7/2005 | Chilton | H05K 7/1492 361/679.57 |
| 7,042,716 B2 | 5/2006 | Shearman | |
| 7,145,773 B2 | 12/2006 | Shearman et al. | |
| 7,580,260 B2 | 8/2009 | Figuerado | |
| 7,948,750 B2 | 5/2011 | Hung et al. | |
| 8,641,107 B2 * | 2/2014 | Wu | H05K 7/20727 292/336.3 |
| 9,603,289 B1 | 3/2017 | Shearman et al. | |
| 9,769,958 B2 | 9/2017 | Jaskela et al. | |
| 10,095,280 B2 | 10/2018 | Bettiga et al. | |
| 10,372,178 B2 | 8/2019 | Chang et al. | |
| 10,729,037 B1 * | 7/2020 | Shearman | H05K 7/1438 |
| 2005/0074990 A1 | 4/2005 | Shearman et al. | |
| 2006/0045457 A1 | 3/2006 | Ng et al. | |
| 2011/0222241 A1 | 9/2011 | Shearman et al. | |
| 2015/0139223 A1 | 5/2015 | Mayenburg et al. | |
| 2017/0083057 A1 | 3/2017 | Bettiga et al. | |

\* cited by examiner

*Primary Examiner* — Robert J Hoffberg
(74) *Attorney, Agent, or Firm* — Clements Bernard Walker; Lawrence A. Baratta, Jr.; Christopher L. Bernard

(57) ABSTRACT

A network device includes a shelf configured to support interface cards on a front side; a control module including a first frame and a printed circuit board disposed to the first frame, wherein the control module is configured to connect on a rear side of the shelf; and a cooling module including a second frame and cooling fans disposed to the second frame, wherein the second frame is configured slidingly connect to the first frame on the rear side of the shelf.

18 Claims, 22 Drawing Sheets

HYBRID CONTROL AND COOLING MODULE WITH INDEPENDENTLY REMOVABLE COOLING SECTION FOR A NETWORK DEVICE

CROSS-REFEENCE TO RELATED APPLICATION(S)

The present disclosure is a continuation of U.S. patent application Ser. No. 16/255,301, filed Jan. 23, 2019, the contents of which are incorporated by reference in their entirety.

FIELD OF THE DISCLOSURE

The present disclosure generally relates to networking hardware. More particularly, the present disclosure relates to systems and methods for a hybrid control and cooling module with an independently removable cooling section for a network device.

BACKGROUND OF THE DISCLOSURE

Network devices include modules, cards, plugs, blades, and the like, which are used to implement some functionality in a network. As described herein, a network device is also a network element, namely a node or device performing some functionality in a network. Examples of network devices include, without limitation, switches, routers, firewalls, appliances, servers, optical terminals, and the like. Two examples of functional devices in a network element include a cooling module, which provides cooling, such as via fans and associated air flow, and a control module, which generally provides operations, administration, maintenance, and provisioning (OAM&P) functionality for the network device. The design trend is towards smaller form-factors, such as so-called "pizza boxes" (which are 1-2 rack unit (RU) high integrated shelves which may include various modules).

In some implementations, cooling modules have been combined with other types of functionality, such as control modules or access panels. Typically, a control module is located on a front side of a network device and plugs into a backplane or midplane. If space permits, control modules can be placed on a rear side of a network device next to cooling modules.

In some known systems, cooling modules have been combined with other modules. In some such known systems, if a single fan rotor malfunctions in a system in which cooling modules are combined with other modules, then the entire hybrid module needs to be replaced at a potentially great expense, with potential down time.

In some other known systems, the control module is located on the front side of a network device and plugs into the front of a mid-plane. In some such known systems, as shelves get shorter in height, the control modules can start to take up an increasingly greater size of the interface cards, thereby potentially resulting in smaller interface cards with possibly less functionality.

In some other known systems, the control module is located on the rear side of a network device next to cooling modules. In some such known systems, cooling capacity and cooling efficiency of the shelf may be reduced. Also, if cards of the control modules are located next to the cooling modules, then the cards of the control modules may not be able to be cooled by the cooling modules.

BRIEF SUMMARY OF THE DISCLOSURE

In an embodiment, a hybrid module for a network device includes a control module for the network device, the control module including: a first frame; a first printed circuit board disposed on the first frame; a plurality of first connectors configured to operably connect the first printed circuit board to mid-plane connectors of a shelf of the network device; a control module mounting system configured to slidably mount first frame to the shelf of the network device; and a cooling module guidance system disposed on the first frame and configured to slidably mount thereon a cooling module for the network device; and a cooling module for the network device, the cooling module being slidably mountable to the control module, the cooling module including: a second frame; a plurality of cooling fans disposed within the second frame; a second printed circuit board disposed on the second frame; a plurality of second connectors configured to operably connect the second printed circuit board to mid-plane connectors of the shelf of the network device; and a cooling module mounting system configured to slidably mount the second frame by engaging the cooling module guidance system in the control module. The control module mounting system can include a pair of parallel control module mounting tabs that extend beyond sides of the first frame.

Each of the control module mounting tabs can include a portion of the first printed circuit board that extends past the sides of the first frame. The cooling module guidance system can include a pair of parallel cooling module slots disposed along bottom sides of the first frame. Each of the cooling module slots can define a channel therein that is configured to slidably receive therein an associated cooling module mounting tab of the cooling module. The cooling module mounting system can include a pair of parallel cooling module mounting tabs that extend beyond sides of the second frame. Each of the cooling module mounting tabs can include a portion of the second printed circuit board that extends past sides of the second frame. The hybrid module can further include a latch disposed on the first frame, the latch being configured to removably latch the hybrid module to a shelf of a network device. The cooling module can be underneath the control module. The hybrid module can further include a fastening mechanism configured to removably attach the cooling module to the control module, wherein the control module includes an attachment feature that defines a threaded hole therein; and wherein the fastening mechanism includes a portion of the second frame that defines a hole therein; and a fastener configured to be insertable through the hole defined in the portion of the second frame and further configured to threadedly engage the threaded hole defined in the portion of the control module.

In another embodiment, a control module for a network device includes a frame; a printed circuit board disposed on the frame; a plurality of connectors configured to operably connect the printed circuit board to mid-plane connectors of a shelf of the network device; a control module mounting system configured to slidably mount the frame to the shelf of the network device; and a cooling module guidance system disposed on the frame and configured to slidably mount thereon a cooling module for the network device. In yet another embodiment, a cooling module for a network device includes a frame; a plurality of cooling fans disposed within the frame; a printed circuit board disposed on the frame; a plurality of connectors configured to operably connect the printed circuit board to mid-plane connectors of a shelf of the network device; and a cooling module mounting system configured to slidably mount the frame to a control module for the network device.

The foregoing is a summary and thus may contain simplifications, generalizations, inclusions, and/or omissions of detail; consequently, those skilled in the art will appreciate that the summary is illustrative only and is not intended to be in any way limiting. Other aspects, features, and advantages of the devices and/or processes and/or other subject matter described herein will become apparent in the disclosures set forth herein.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

In various embodiments, the present disclosure relates to systems and methods for a hybrid control and cooling module with an independently removable cooling section for a network device.

By way of non-limiting overview, in various embodiments a control module and a cooling module can share space on a rear side of a network device, such as without limitation a low-profile optical platform (like a pizza box), thereby helping contribute to increasing space on a front side of a shelf of the network device (such as for, without limitation, interface card placement).

Still by way of non-limiting overview, in various embodiments a control module or a set of control modules can be placed in a space usually reserved in currently-known networking hardware only for rear cooling modules. To that end, in various embodiments a control module is placed on the rear side of a shelf in a location where the control module can be cooled by the same set of system fans that cool the rest of the electronics in the shelf.

Still by way of non-limiting overview, in various embodiments a cooling module may be guided into a back-plane and/or mid-plane connection system such that the cooling module can be treated as independent from the control module.

Still by way of non-limiting overview, it will be appreciated that various embodiments may help provide for in-service replacement of a semi-hidden control module, a combined control and cooling module, and/or an independent cooling module which can help contribute to increased rear space for desired fan placement.

Still by way of overview, it will be appreciated that various embodiments can help contribute to providing a small form factor system with a control module and/or dual control modules that has left a not insubstantial portion of the front of the system for interface module space, fiber and cable connections, and/or the like. Thus, it will be appreciated that various embodiments can help contribute to use of interface cards that can tend to be among the larger interface cards used in the industry relative to space available on the front of the system while still providing redundant control.

Figure 1:
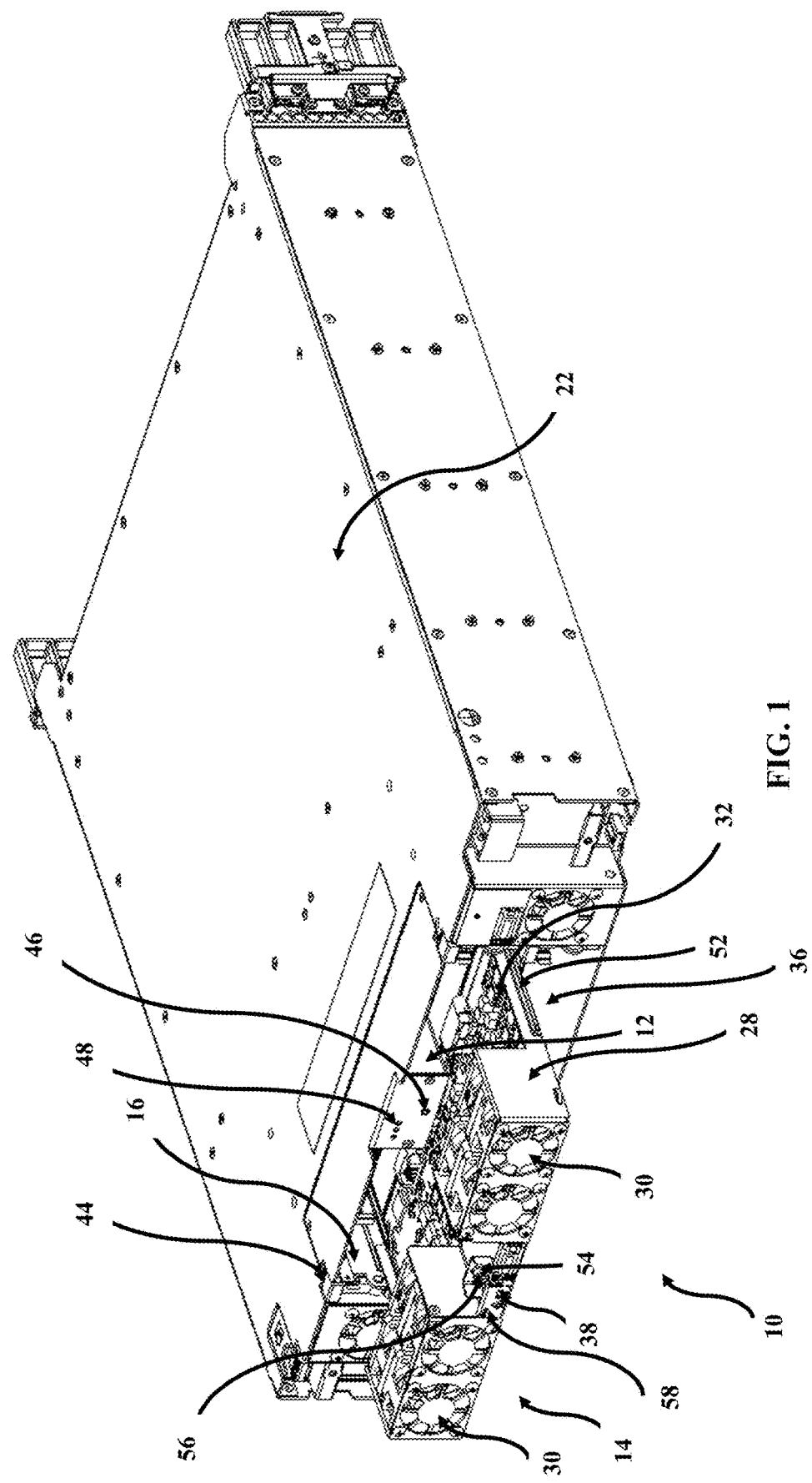
FIG. 1 is a front perspective view of an illustrative cooling module being slidably mounted underneath an illustrative control module in a shelf of a network device.
Figure 2A:
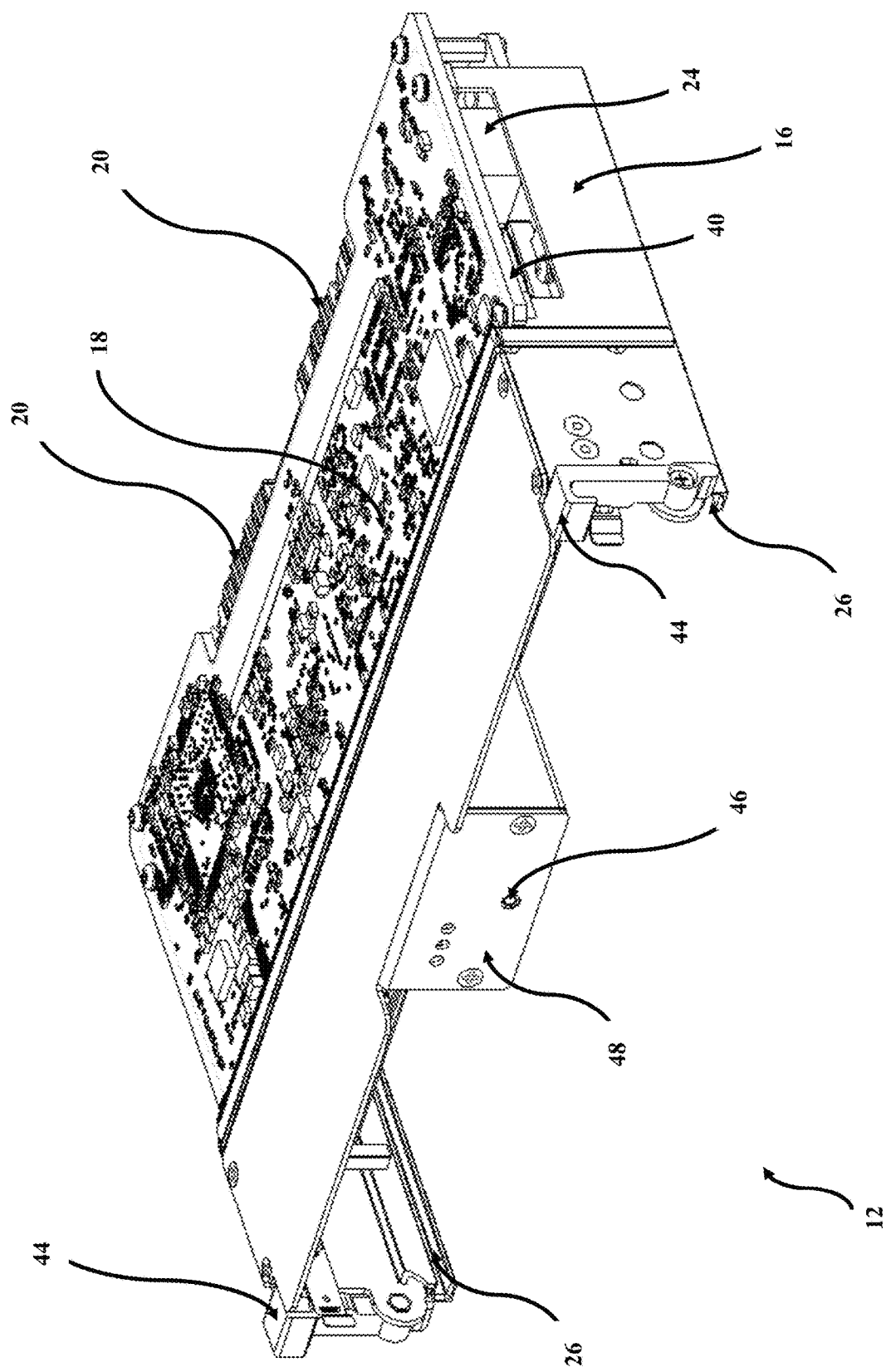
FIG. 2A is a front perspective view of an illustrative control module.
Figure 4A:
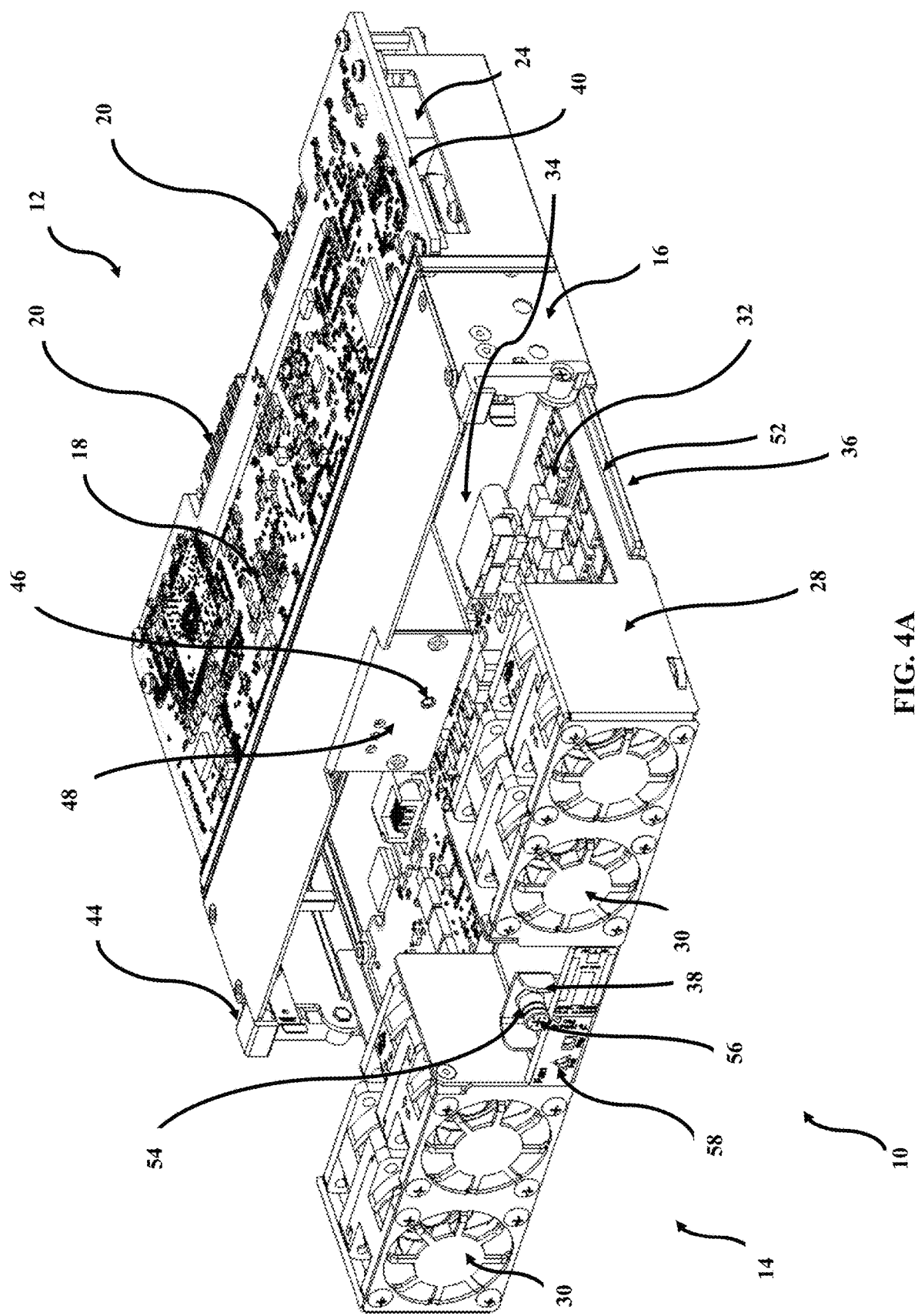
FIG. 4A is a front perspective view of an illustrative cooling module for a network device being slidably mounted underneath an illustrative control module for a network device.
Figure 4B:
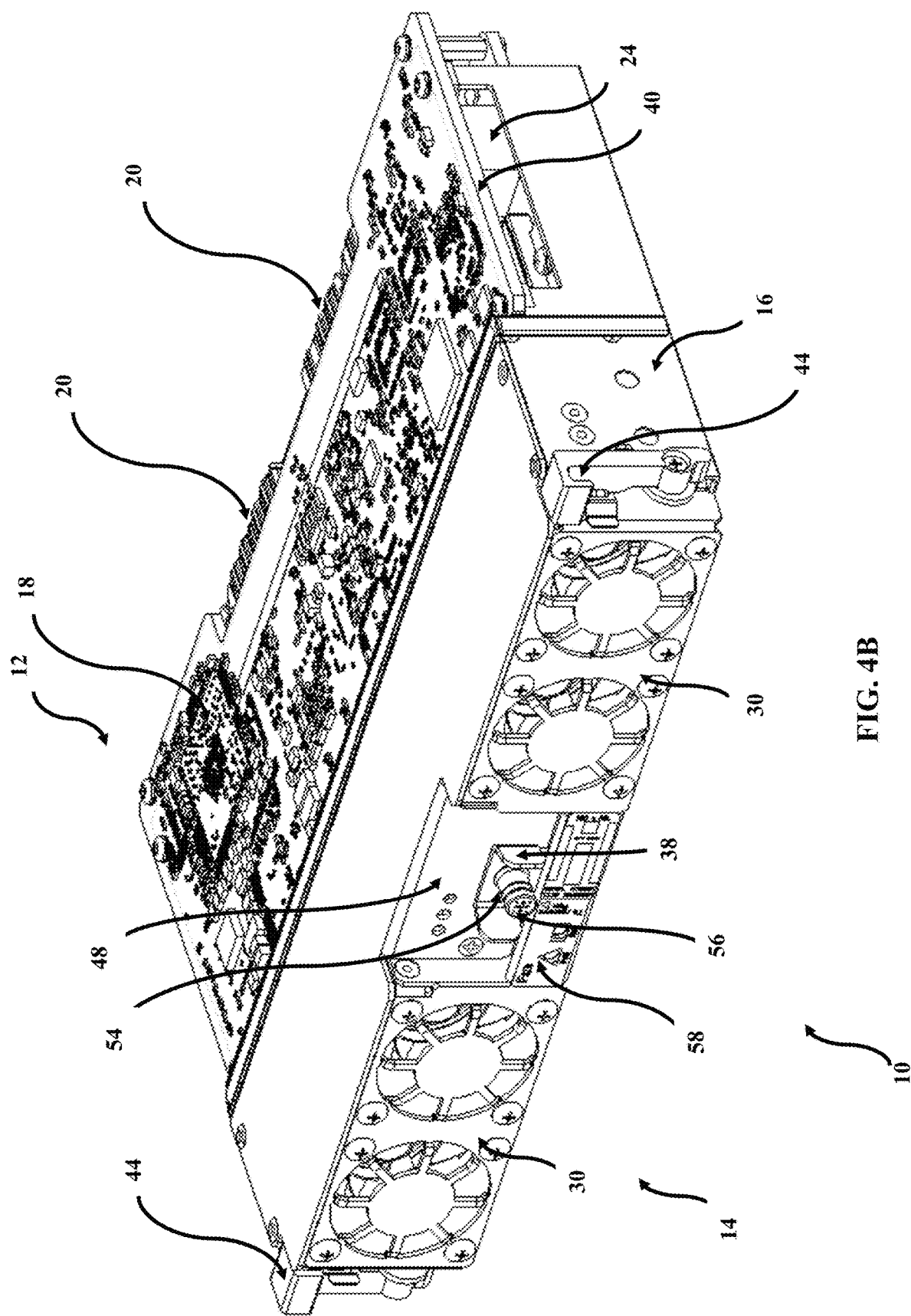
FIG. 4B is a front perspective view of a hybrid module including the cooling module of FIG. 4A slidably mounted underneath the control module of FIG. 4A.
Figure 4C:
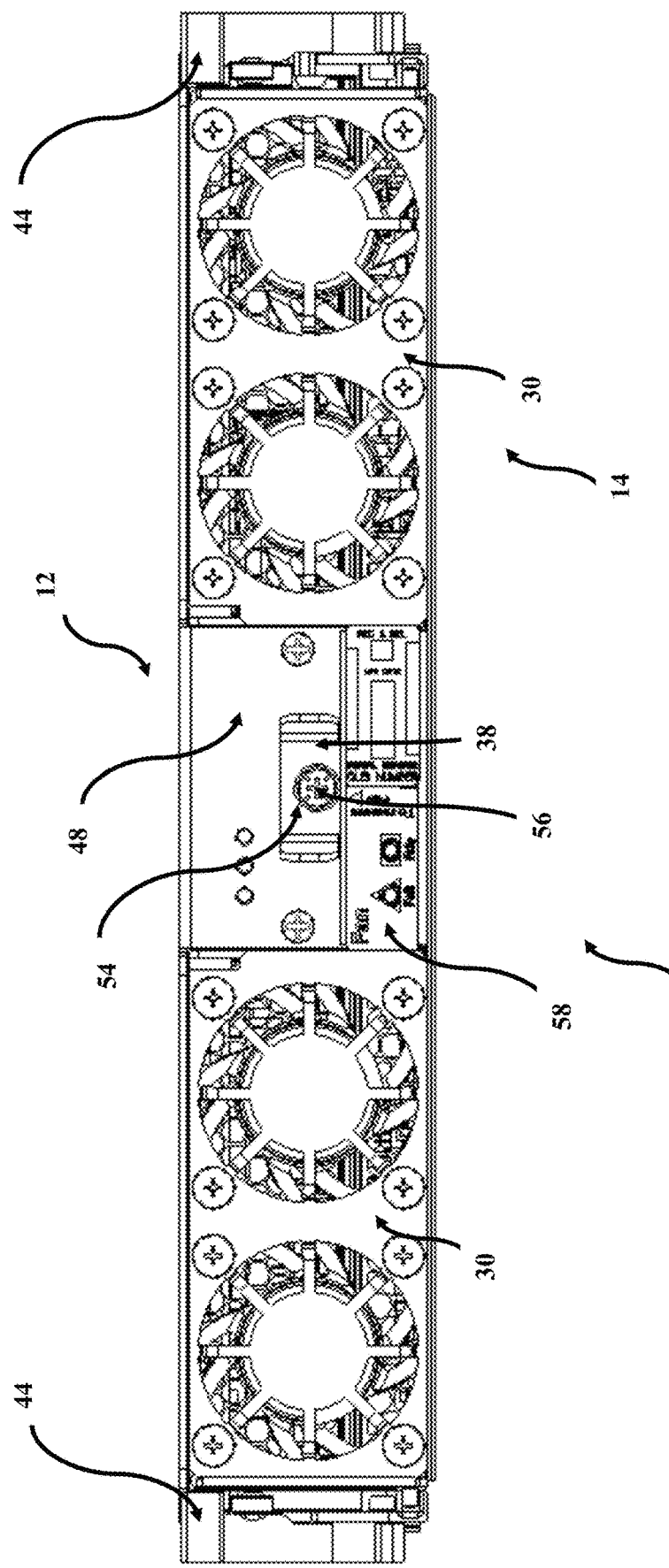
FIG. 4C is a front plan view of the hybrid module of FIG. 4B.
Figure 4D:
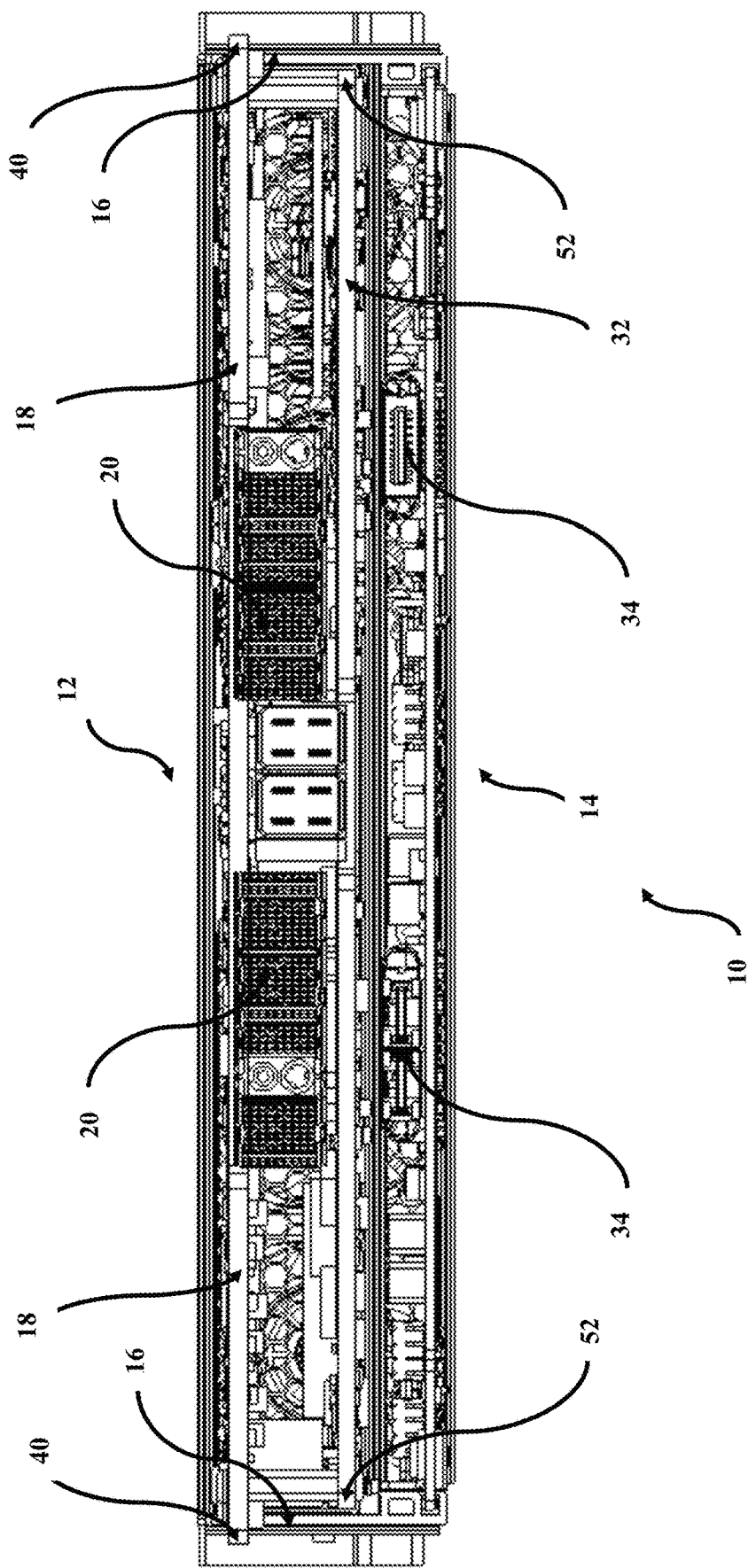
FIG. 4D is a rear plan view of the hybrid module of FIG. 4B.
Figure 4E:
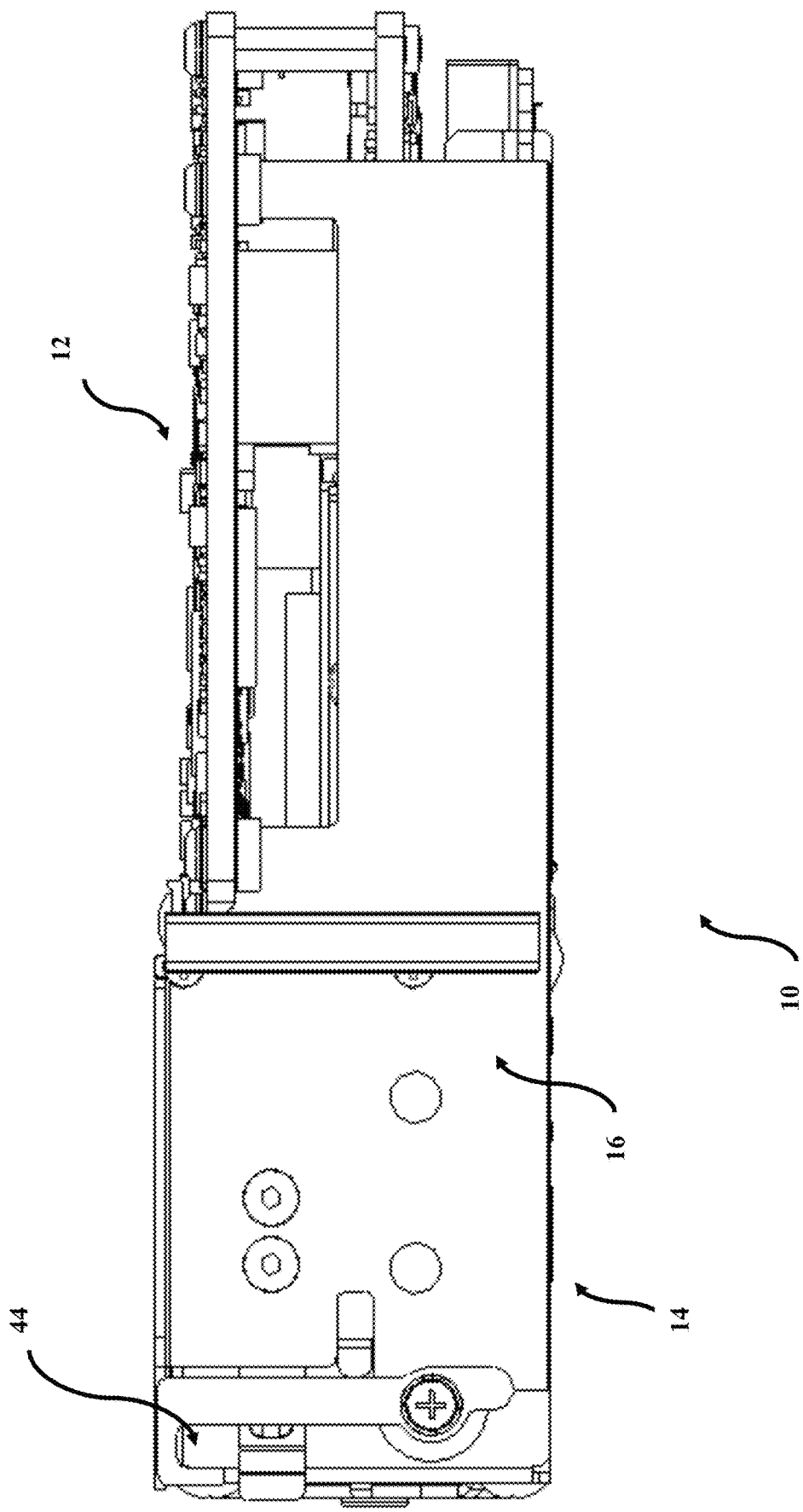
FIG. 4E is a side plan view of the hybrid module of FIG. 4B.

Continuing by way of overview and referring now to FIGS. 1, 2A, and 4A, in various embodiments an illustrative hybrid module 10 for a network device (embodied in a shelf 22) includes a control module 12 for the network device and a cooling module 14 for the network device, and the cooling module 14 is slidably mountable to the control module 12. The control module 12 includes a frame 16. A printed circuit board 18 is disposed on the frame 16. Connectors 20 are configured to operably connect the printed circuit board 18 to mid-plane connectors (not shown) of a shelf 22 of the network device. A control module mounting system 24 is configured to slidably mount the control module 12 to the shelf 22. A cooling module guidance system 26 is disposed on the frame 16 and is configured to slidably mount thereon the cooling module 14. The cooling module 14 includes a frame 28. Cooling fans 30 are disposed within the frame 28. A printed circuit board 32 is disposed on the frame 28. Connectors 34 are configured to operably connect the printed circuit board 32 to mid-plane connectors (not shown) of the shelf 22. A cooling module mounting system 36 is configured to slidably mount the cooling module 14 to the control module 12. A fastening mechanism 38 is configured to removably attach the cooling module 14 to the control module 12.

Now that a non-limiting overview has been presented, details will be set forth by way of non-limiting examples given only by way of illustration.

The foregoing illustrative descriptions of the hybrid module 10, the control module 12, and the cooling module 14 are made with reference to the hybrid module 10, the control module 12, and/or the cooling module 14 in single- and a multi-shelf chassis configurations. For example and without limitation, the hybrid module 10, the control module 12, and/or the cooling module 14 can be used in a line system (such as without limitation a reconfigurable line system), a Terabit switching system, switching Time Division Multiplexing (TDM) and/or packet traffic. Those of ordinary skill in the art will recognize the hybrid module 10, the control module 12, and/or the cooling module 14 can be implemented with any type of network element, node, and the like in various applications such as telecommunications, networking, data center interconnection, high-performance computing, storage, and the like, and reference to the hybrid module 10, the control module 12, and/or the cooling module 14 is merely for illustration of illustrative embodiments. Additionally, systems and methods disclosed herein could equally apply to chassis as desired for a particular application. Moreover, it will be appreciated that the shelf 22 may include a small form factor telecommunications/data shelf, such as a pizza box.

Referring additionally to FIGS. 2B-2E, various features of the control module 12 will be explained by way of non-limiting examples given by way of illustration only. In various embodiments, the control module 12 may perform control functions and generate timing and control signals for local craft access, security, event history, alarms, and controls for packet switching, time division multiplexing, and the like.

Figure 2B:
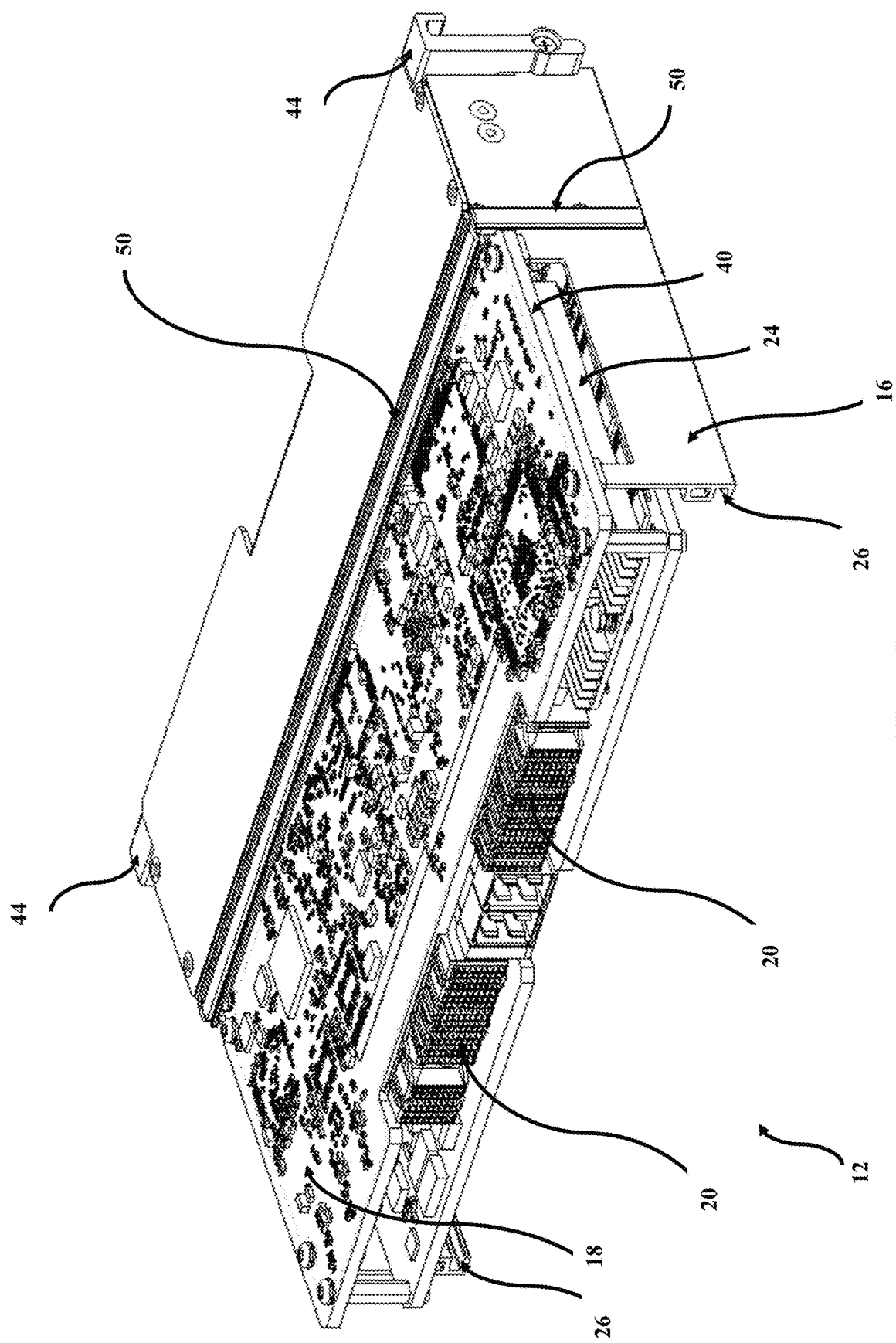
FIG. 2B is a rear perspective view of the control module of FIG. 2A.
Figure 2C:
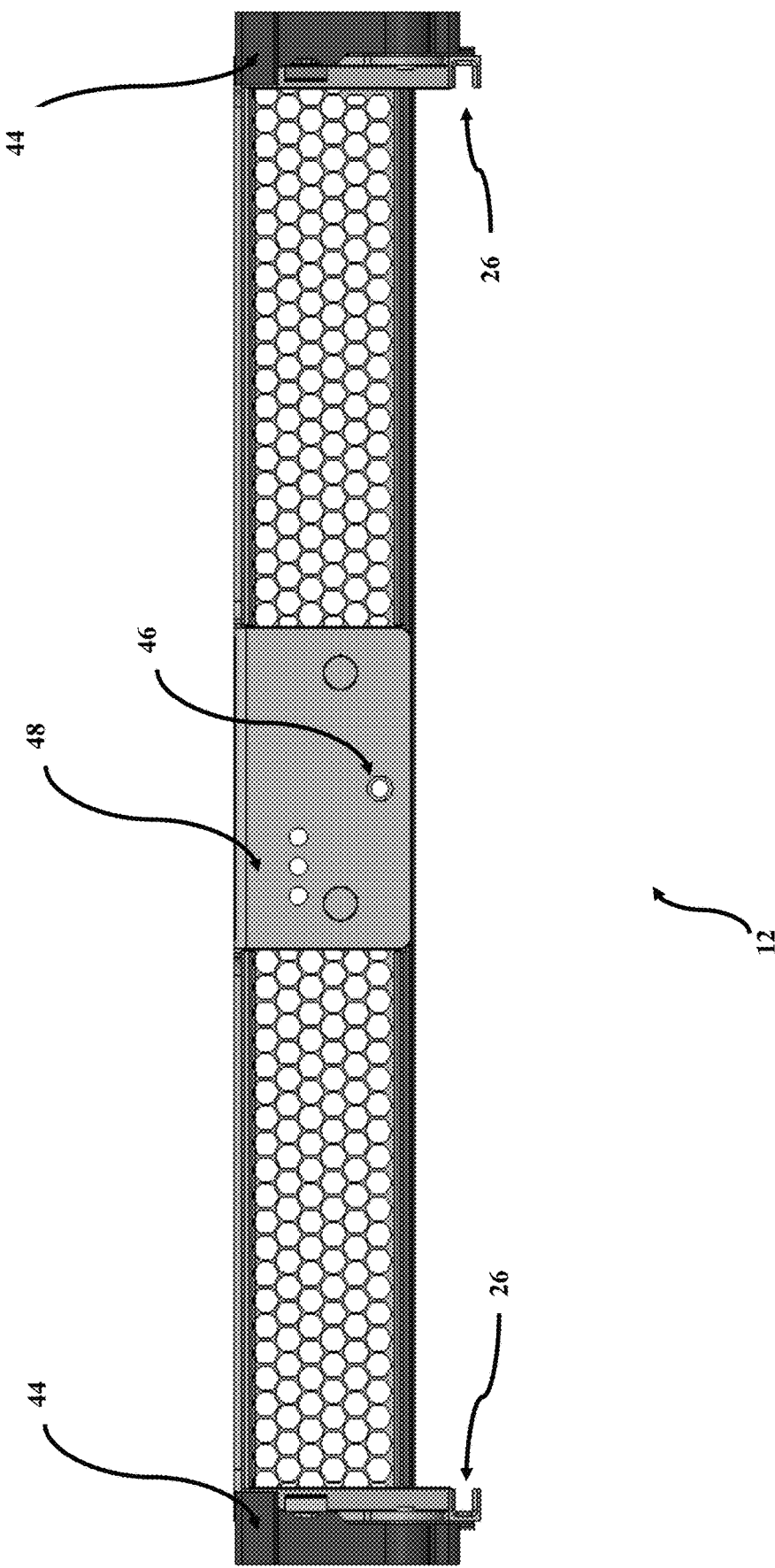
FIG. 2C is a front plan view of the control module of FIG. 2A.
Figure 2D:
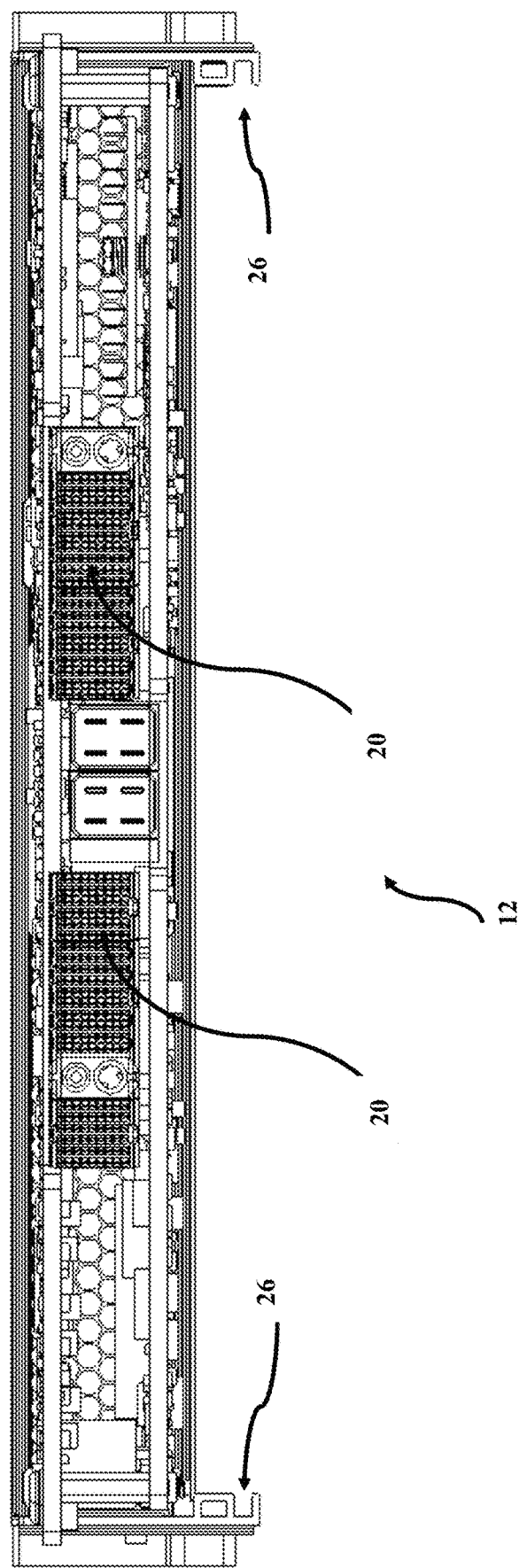
FIG. 2D is a rear plan view of the control module of FIG. 2A.
Figure 2E:
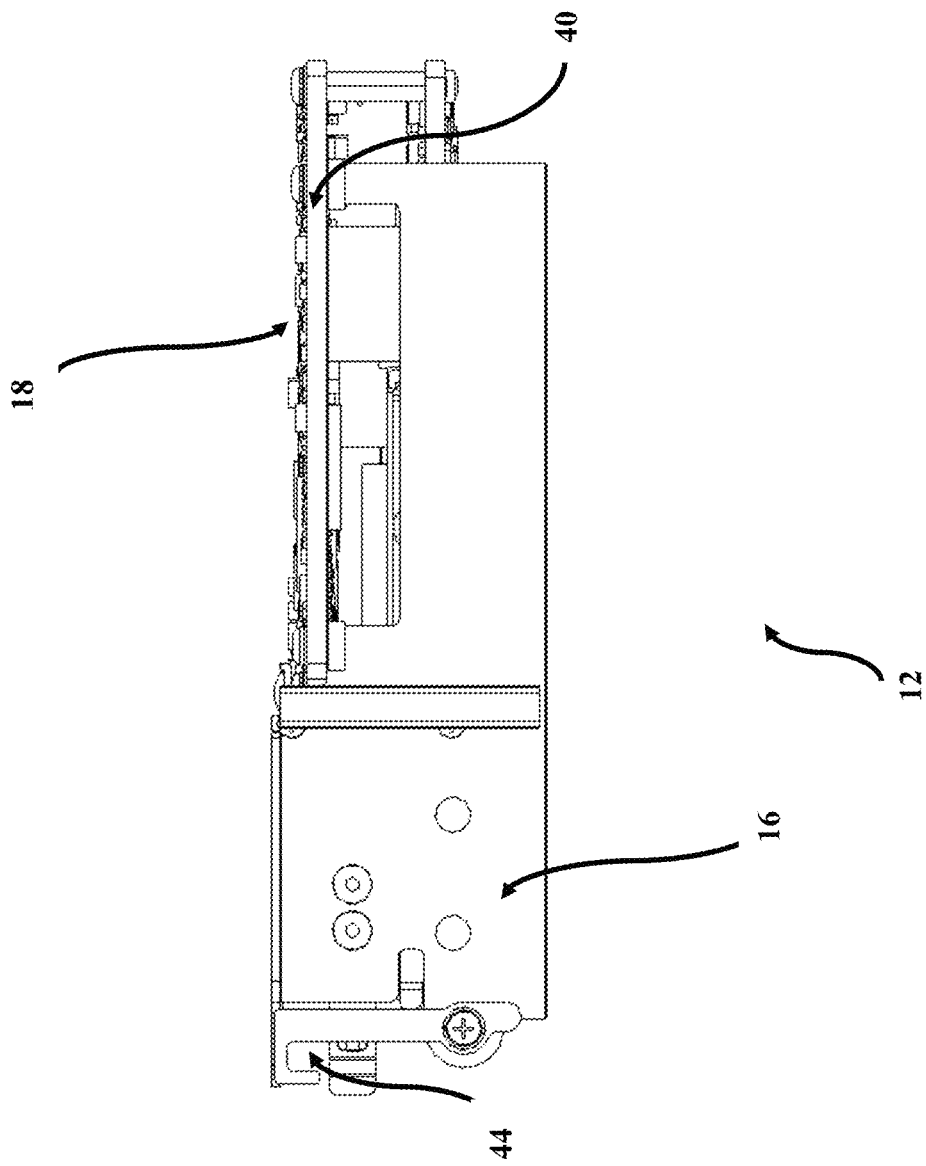
FIG. 2E is a side plan view of the control module of FIG. 2A.
Figure 5A:
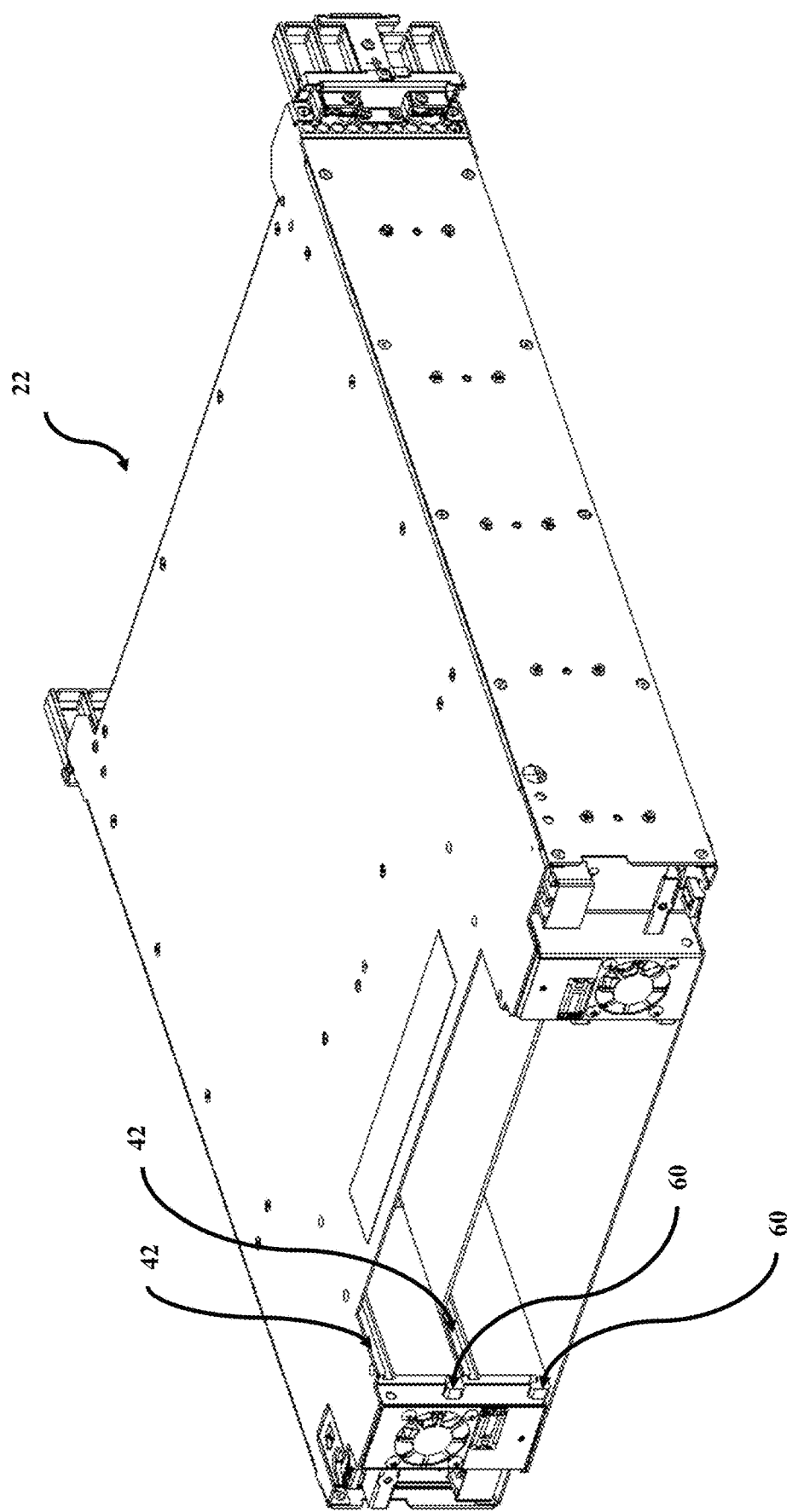
FIG. 5A is a rear perspective view of an illustrative shelf of a network device.
Figure 5B:
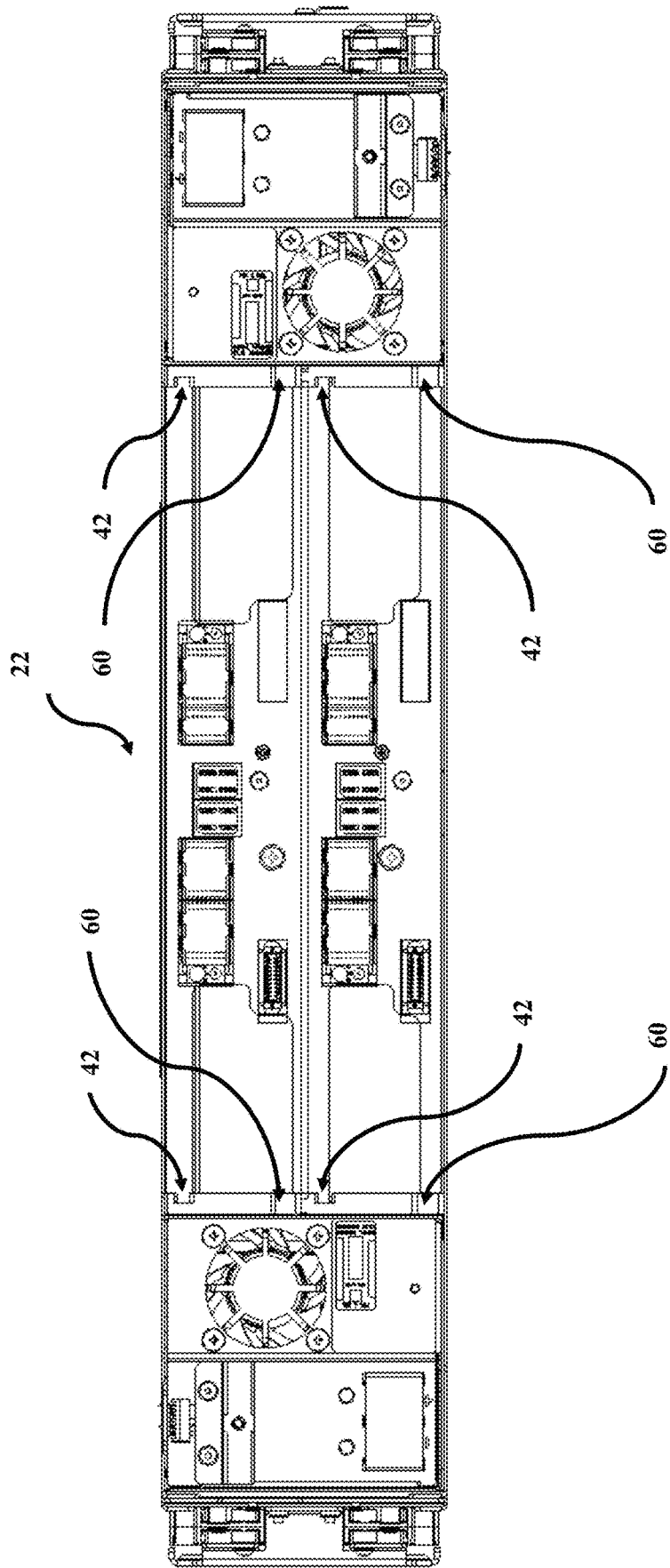
FIG. 5B is a rear plan view of the shelf of FIG. 5A.

In various embodiments and as shown in FIGS. 2A, 2B, and 2C, the control module mounting system 24 includes a pair of parallel control module mounting tabs 40 that extend beyond sides of the frame 16. In some such embodiments, each of the control module mounting tabs 40 includes a portion of the printed circuit board 18 that extends past the sides of the frame 16. Referring briefly to FIGS. 5A and 5B, it will be appreciated that in various embodiments the control module mounting tabs 40 are slidably receivable in control module guide slots 42 disposed in the shelf 22 between a rear of the shelf 22 and a mid-plane of the shelf 22.

In various embodiments and as shown in FIGS. 2A, 2B, 2C, and 2D, the cooling module guidance system 26 includes a pair of parallel cooling module slots disposed along bottom sides of the frame 16. In such embodiments, each of the cooling module slots 26 defines a channel therein that is configured to slidably receive therein an associated cooling module mounting tab (discussed below) of the cooling module 12.

In various embodiments and as shown in FIGS. 2A, 2B, 2C, and 2E, a latch 44 is disposed on the frame 16. In such embodiments, the latch 44 is configured to removably latch the hybrid module 10 to the shelf 22. It will be appreciated that the latch 44 is configured to provide a sufficient mating force to mate the connectors 20 to their associated connectors of the mid-plane of the shelf 22, thereby operably connecting the control module 12 and modules, such as interface cards, on the front of the shelf 22 and providing power to the control module 12. For example, the latch 44 is disposed at front sides of the frame 16 such that when the control module 12 is slidably received in the shelf 22 the latch 44 will engage latching features (discussed below) disposed at the rear of the shelf 22.

In various embodiments and as shown in FIGS. 1, 2A, and 2C, the control module 12 suitably includes an attachment feature 46. In such embodiments, the attachment feature 46 suitably is configured to releasably engage an associated component (discussed below) that urges a portion of the cooling module 14 toward and into physical contact with a portion of the control module 12. In some such embodiments, the attachment feature 46 may include a threaded hole that is configured to threadedly engage a threaded fastener. It will be appreciated that the attachment feature may be suitably disposed at any location about the control module 12 as desired. For examples and given by way of illustration only, in various embodiments the attachment feature 46 may be located at a display panel 48.

In various embodiments and as shown in FIG. 2B, electromagnetic interference (EMI) gaskets 50 may be disposed about a portion of the frame 16. It will be appreciated that the EMI gaskets 50 suitably form a boundary of a Faraday cage for blocking electrical fields such that EMI can be reduced or, in some cases, prevented.

Figure 3A:
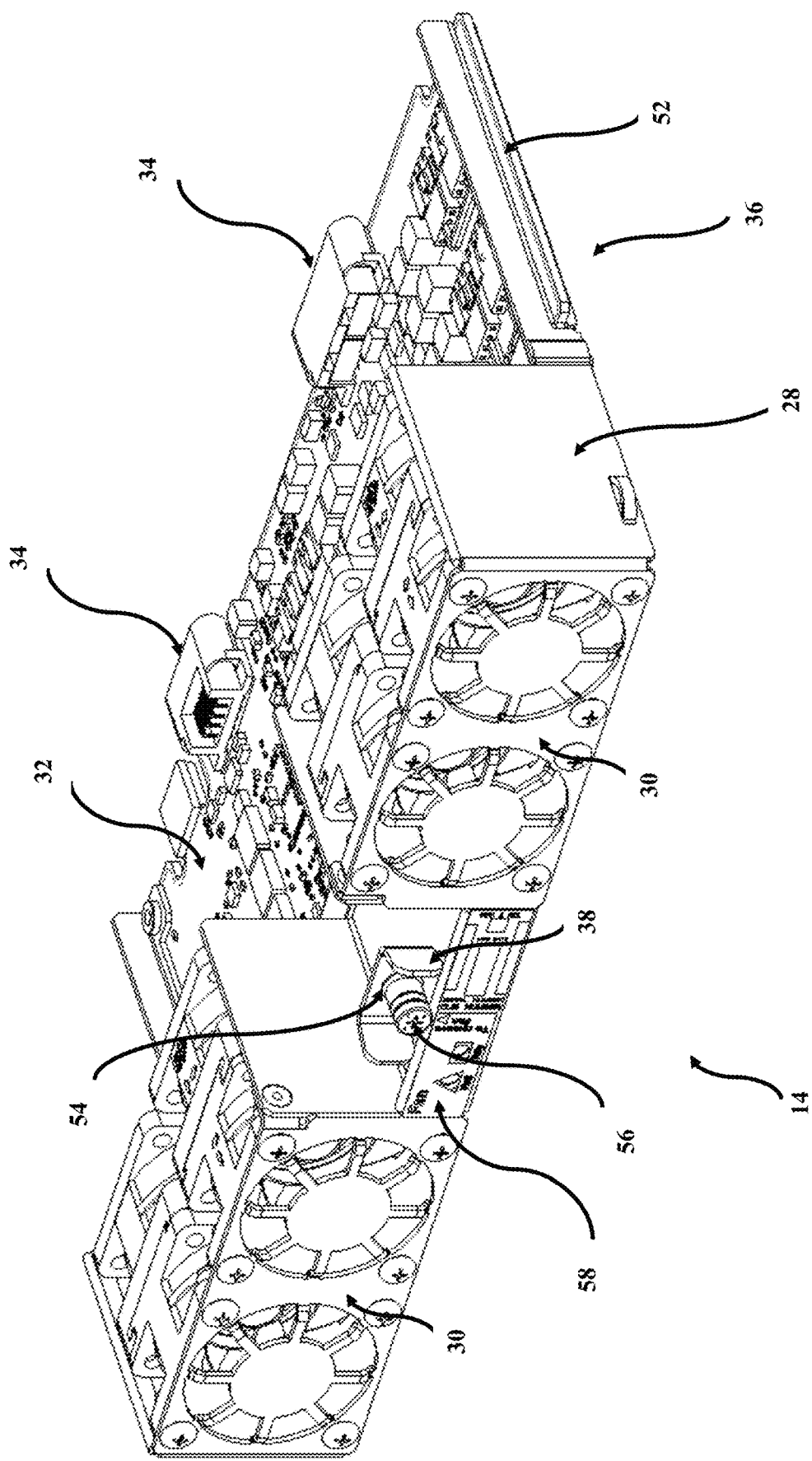
FIG. 3A is a front perspective view of an illustrative cooling module.
Figure 3B:
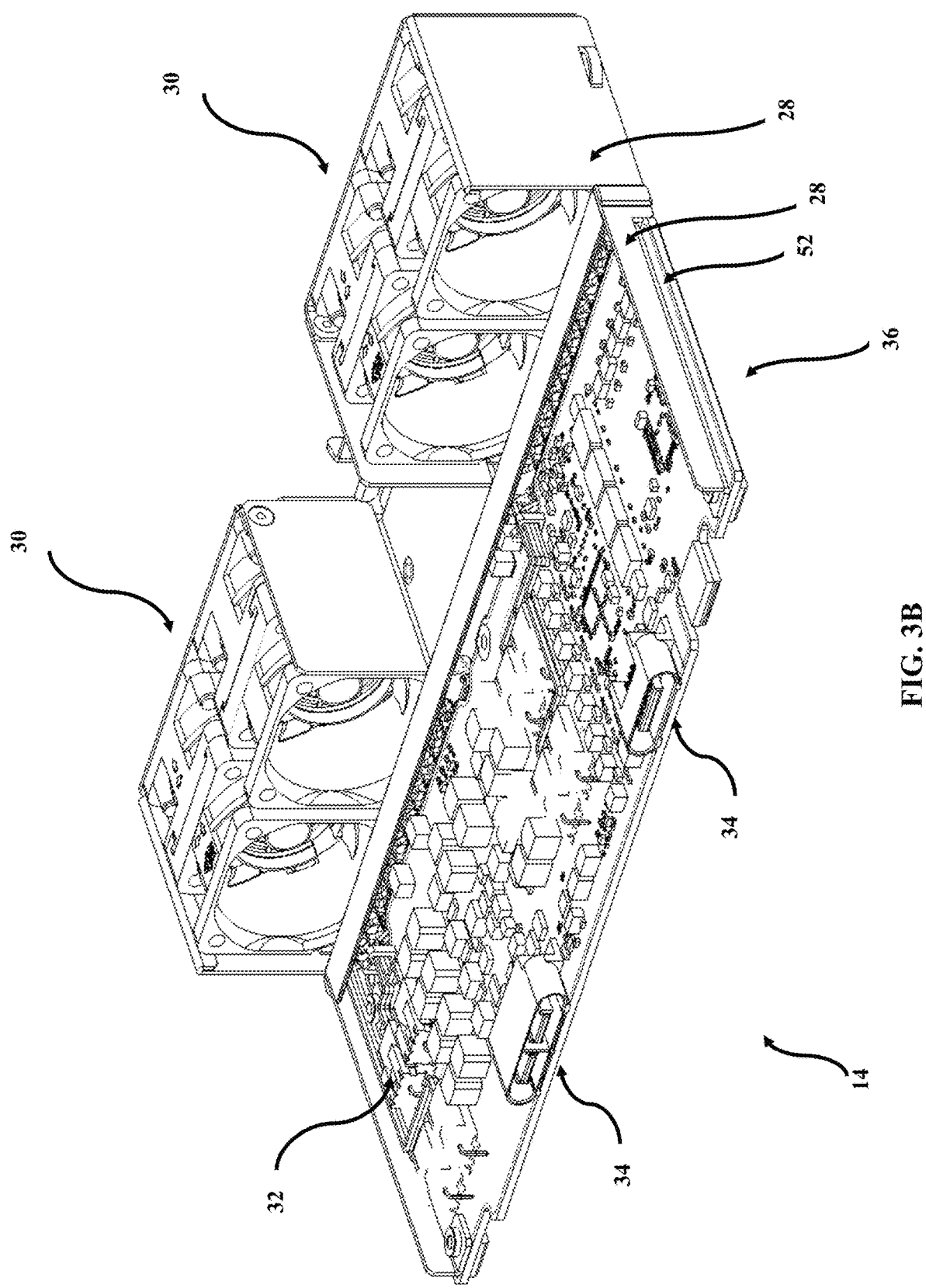
FIG. 3B is a rear perspective view of the cooling module of FIG. 3A.
Figure 3C:
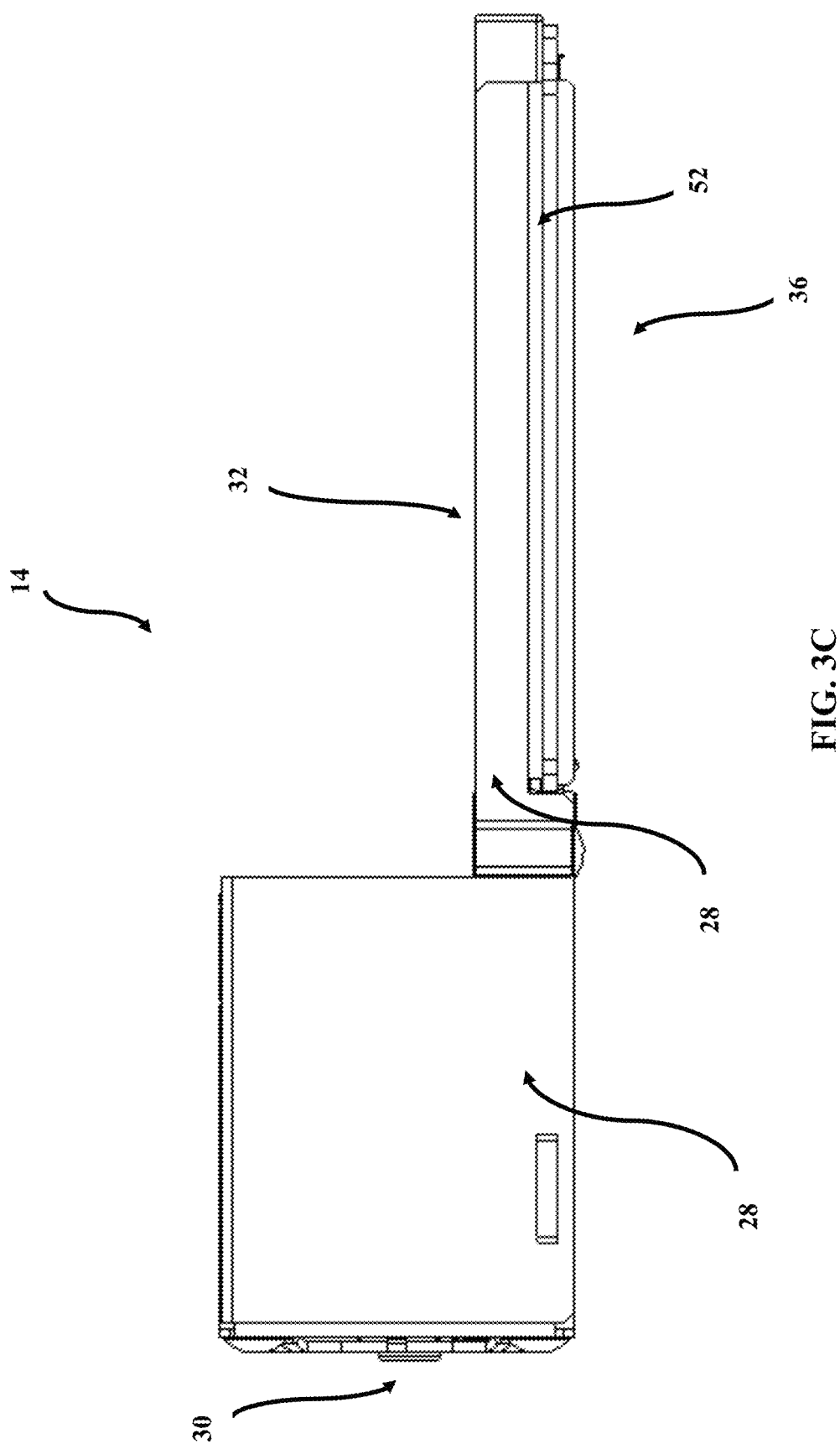
FIG. 3C is a side plan view of the cooling module of FIG. 3A.

Referring additionally to FIGS. 3A, 3B, and 3C, various features of the cooling module 14 will be explained by way of non-limiting examples given by way of illustration only. In various embodiments, the cooling fans 30 are configured to provide cooling air for components that are mounted in the same shelf 22 as the cooling module 14. For example, the cooling fans 30 may provide cooling air to electronic components disposed on the printed circuit boards 18 and 32 (both of which are mounted aft of the mid-plane of the shelf 22) and to any components, such as without limitation interface cards (not shown) that may be mounted forward of the mid-plane of the shelf. The cooling fans 30 may include any suitable cooling fans known in the art for providing cooling air for components of network devices. While various embodiments disclosed herein show four of the cooling fans 30 per each cooling module 14, it will be appreciated that the cooling module 14 may include any number of cooling fans 30 as desired for a particular application.

In various embodiments, the cooling module mounting system 36 includes a pair of parallel cooling module mounting tabs 52 that extend beyond sides of the frame 28. In some such embodiments, each of the cooling module mounting tabs 52 includes a portion of the printed circuit board 32 that extends past the sides of the frame 28. It will be appreciated that in various embodiments the cooling module mounting tabs 52 are slidably receivable in the cooling module slots 26 that are disposed along the bottom sides of the frame 16 of the control module 12 (FIGS. 2A, 2B, 2C, and 2D).

In various embodiments and as mentioned above, the fastening mechanism 38 is configured to removably attach the cooling module 14 to the control module 12. In such embodiments and as discussed above, the control module 12 includes the attachment feature 46 that suitably defines a threaded hole therein. In such embodiments the fastening mechanism 38 includes a portion of the frame 28 that defines a hole 54 therein. A fastener 56, such as a threaded fastener, is configured to be insertable through the hole 54 and is further configured to threadedly engage the threaded hole 46. In some embodiments, the fastening mechanism 38 may be disposed above an indication panel 58 that is located in a central space on the front of the cooling module 14 between spaced-apart cooling fans 30. In such embodiments, the threaded fastener 56 is inserted through the hole 54 and threadedly engages the threaded hole 46, thereby urging the portion of the cooling module 14 that defines the hole 54 therein toward and into physical contact with the portion of the control module 12 that defines the threaded hole 46 therein.

It will be appreciated that, as shown in FIGS. 1 and 4A-4E, in various embodiments, layout of components on the control module 12 and components on the cooling module 14 cooperate to help permit the cooling module 14 to be slidably mounted into and underneath the control module 12. Thus, various embodiments of the hybrid module 10 include the control module 12 and the cooling module 14 that is mounted into and underneath the control module 12.

For example, in various embodiments the frame 28 is L-shaped, thereby imparting to the cooling module 14 a low-profile section for the printed circuit board 32. As another example and as discussed above, the fastening mechanism 38 may be disposed above an indication panel 58 that is located in a central space on the front of the cooling module 14 between spaced-apart cooling fans 30. In such embodiments, the threaded hole 46 of the control module 12 is alignable with the hole 54 of the cooling module 14. Thus, in such embodiments the cooling module 14 can be slidably mounted into the control module 12. In some such embodiments, when the cooling module 14 is mounted to the control panel 12, the display panel 48 is presented above the indication panel 58. It will be appreciated that placement of the control module 12 behind the cooling module 14 allows for placement of many redundant cooling fans 30, thereby helping to increase cooling air available for the control module 12 and, is applicable, any modules, such as interface cards, installed forward of the mid-plane of the shelf 22.

As another example and as discussed above, because in various embodiments the cooling module mounting tabs 52 include a portion of the printed circuit board 32 (that has a low profile). As a result, the cooling module 14 can be slidably mounted underneath the control module 12.

As shown in FIG. 1, in some embodiments the cooling module 14 may be mounted to the control module 12 after the control module 12 already has been installed in the shelf 22. In such embodiments, the cooling module 14 slides (as a result of the cooling module mounting tabs 52 sliding through the slots of the cooling module guidance system 26) to the mid-plane of the shelf 22, whereupon the connectors 34 mate with corresponding connectors in the mid-plane of the shelf 22, thereby operably connecting the cooling module 14 and the control module 12 and providing electrical power to the cooling module 14. The threaded fastener 56 threadedly engages the threaded hole 46 to attach the cooling module 14 to the control module 12.

It will be appreciated that, as shown in FIG. 4A, in some other embodiments the cooling module 14 may be mounted to the control module 12 without the control module 12 already having been installed in the shelf 22. As shown in FIGS. 4B-4E, the cooling module 14 has been mounted to and removably attached to the control module 12, thereby forming the hybrid module 10, without the control module 12 already having been installed in the shelf 22. As a result, the hybrid module 10 is ready for mounting and installation as a single unit in the shelf 22. In such embodiments, the control module mounting tabs 40 of the control module 12 of the single-unit hybrid module 10 are inserted into the control module guide slots 44 of the shelf 22. The hybrid module is slid to the mid-plane of the shelf 22 until the connectors 20 and 34 engage corresponding connectors at the mid-plane of the shelf 22 and the latch 44 and the latching feature 60 latchingly engage each other to latch the hybrid module in the shelf 22.

Referring additionally to FIGS. 5A and 5B, the shelf 22 is configured to slidably receive and mount therein the hybrid module 10 (not shown in FIGS. 5A and 5B). As discussed above, in various embodiments the control module guide slots 42 are configured to slidably receive therein the control module mounting tabs 40 (not shown in FIGS. 5A and 5B). In addition and as mentioned above, in various embodiments latching features 60 are disposed at a rear opening of the shelf 22. Each latching feature 60 is located and configured to releasably latchingly engage a corresponding latch 44 (not shown in FIGS. 5A and 5B). In various embodiments and as mentioned above, the shelf 22 may include a small form factor telecommunications/data shelf, such as a pizza box.

Figure 6A:
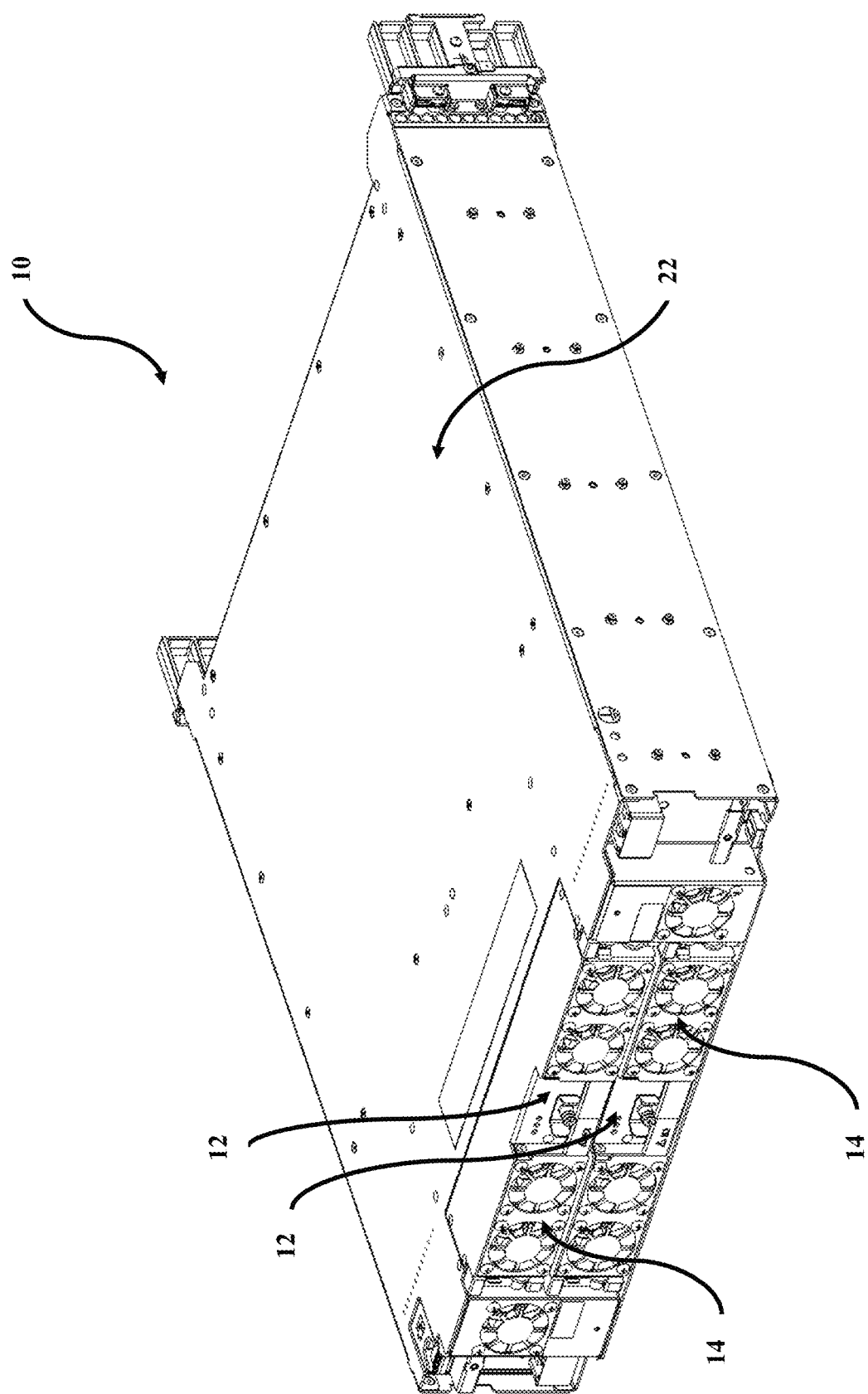
FIG. 6A is a rear perspective view of two hybrid modules of FIG. 4B mounted in the shelf of FIG. 5A.
Figure 6B:
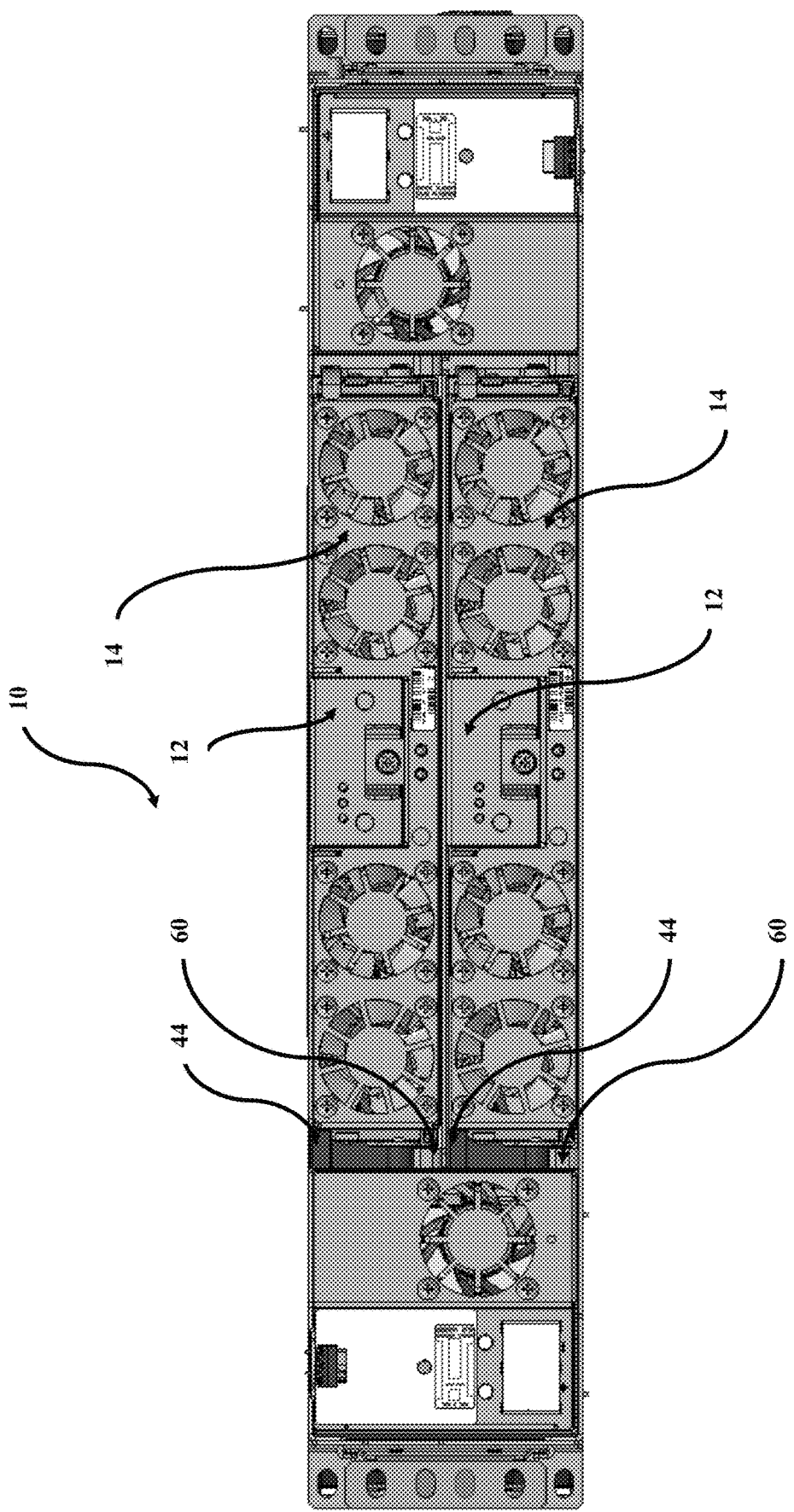
FIG. 6B is a rear plan view of two hybrid modules of FIG. 4B mounted in the shelf of FIG. 5A.

Referring additionally to FIGS. 6A and 6B, in various embodiments two hybrid modules 10 may be mounted in the shelf 22 as described above. It will be appreciated that the two hybrid modules 10 mounted in the shelf 22 may suitably result from: (i) both of the control modules 10 being installed first in the shelf 22 and then both of the cooling modules 14 being mounted to both of the control modules 12; or (ii) one of the control modules 10 being installed first in the shelf 22 and then one of the cooling modules 14 being mounted to the control module 12 and additionally installing a single-unit hybrid module 10 (discussed above) in the shelf 22; or (iii) installing two single-unit hybrid modules 10 (discussed above) in the shelf 22. It will also be appreciated that two of the hybrid modules 10 need not be installed in the shelf 22. To that end, in some embodiments only one hybrid module 10 is installed in the shelf 22.

In view of the non-limiting examples set forth herein by way of illustration, it will be appreciated that in various embodiments the control module 12 of the hybrid module 10 can be removably latched into the shelf 22 and share the space of the removable cooling module 14 (which is removably attached to the control module 12.

It will also be appreciated that, when the fastener 56 is undone, the cooling module 14 can be removed for replacement on its own without affecting operation of the control module 12. On the other hand, the hybrid module 10 can be removed or installed as a single unit with the set of latches 44. In such cases, removal and subsequent replacement of the hybrid module 10 allows for quick replacement of a control module 12 to help reduce temperature rise due to missing cooling modules 14.

Following are a series of flowcharts depicting implementations. For ease of understanding, the flowcharts are organized such that the initial flowcharts present implementations via an example implementation and thereafter the following flowcharts present alternate implementations and/or expansions of the initial flowchart(s) as either sub-component operations or additional component operations building on one or more earlier-presented flowcharts. Those having skill in the art will appreciate that the style of presentation utilized herein (e.g., beginning with a presentation of a flowchart(s) presenting an example implementation and thereafter providing additions to and/or further details in subsequent flowcharts) generally allows for a rapid and easy understanding of the various process implementations.

Figure 7A:
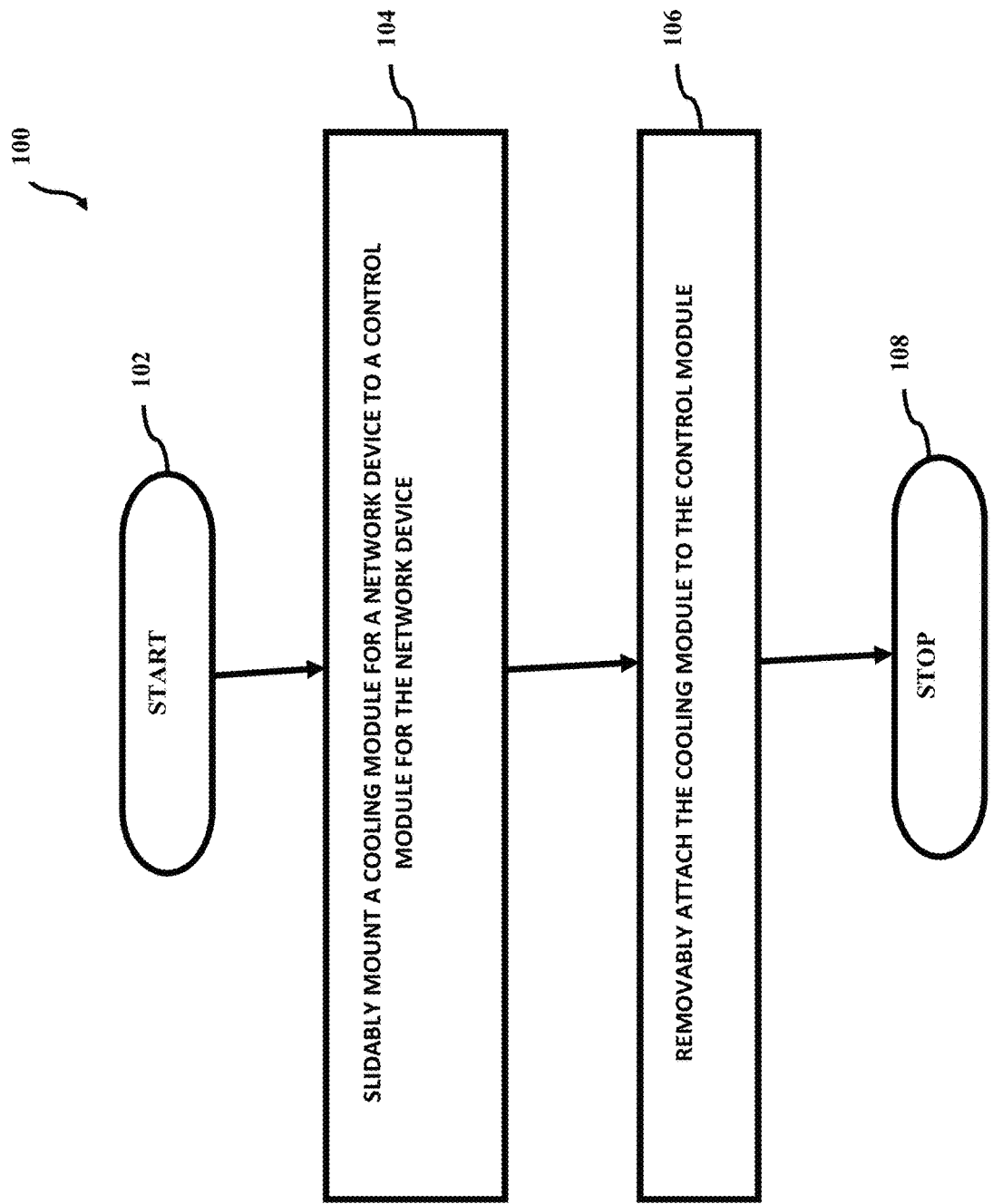
FIG. 7A is a flowchart of an illustrative method of slidably installing a control module in a shelf of a network device and mounting a cooling module to the control module.

Referring now to FIG. 7A, an illustrative method 100 is provided for forming a hybrid module for a network device. It will be appreciated that the method 100 may be well-suited for forming the hybrid module 10, discussed above. The method 100 starts at a block 102. At a block 104 a cooling module for a network device is slidably mounted to a control module for the network device. At a block 106 the cooling module is removably attached to the control module. The method 100 stops at a block 108.

Figure 7B:
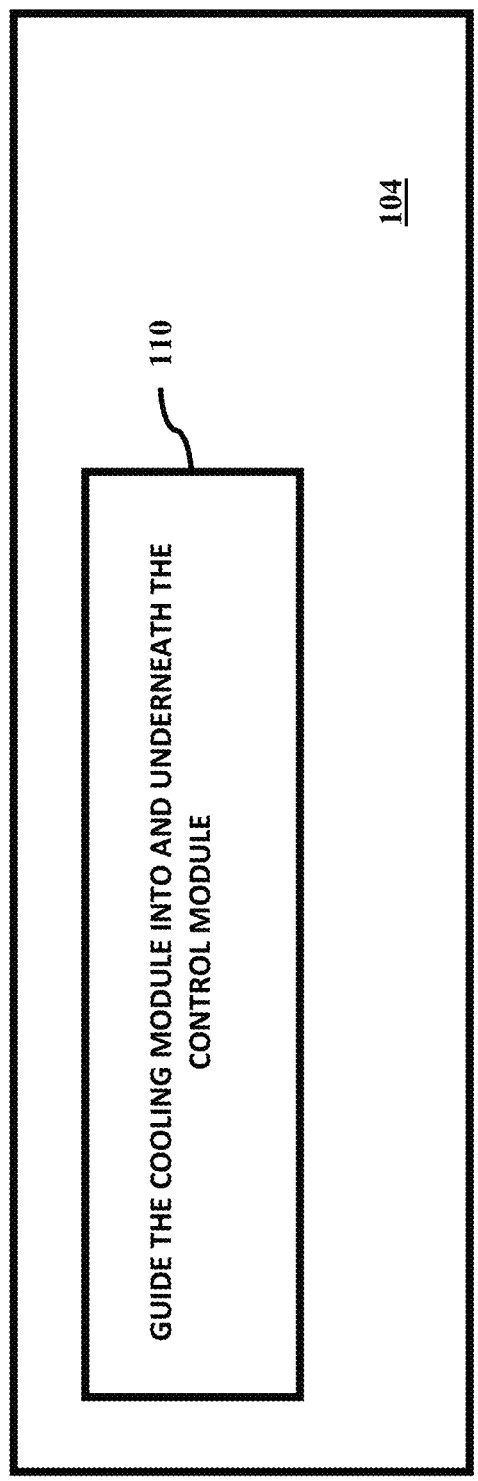
FIGS. 7B and 7C illustrate details of the method of FIG. 7A.

In various embodiments and referring additionally to FIG. 7B, slidably mounting the cooling module to the control module at the block 104 may include guiding the cooling module into and underneath the control module at a block 110.

Figure 7C:
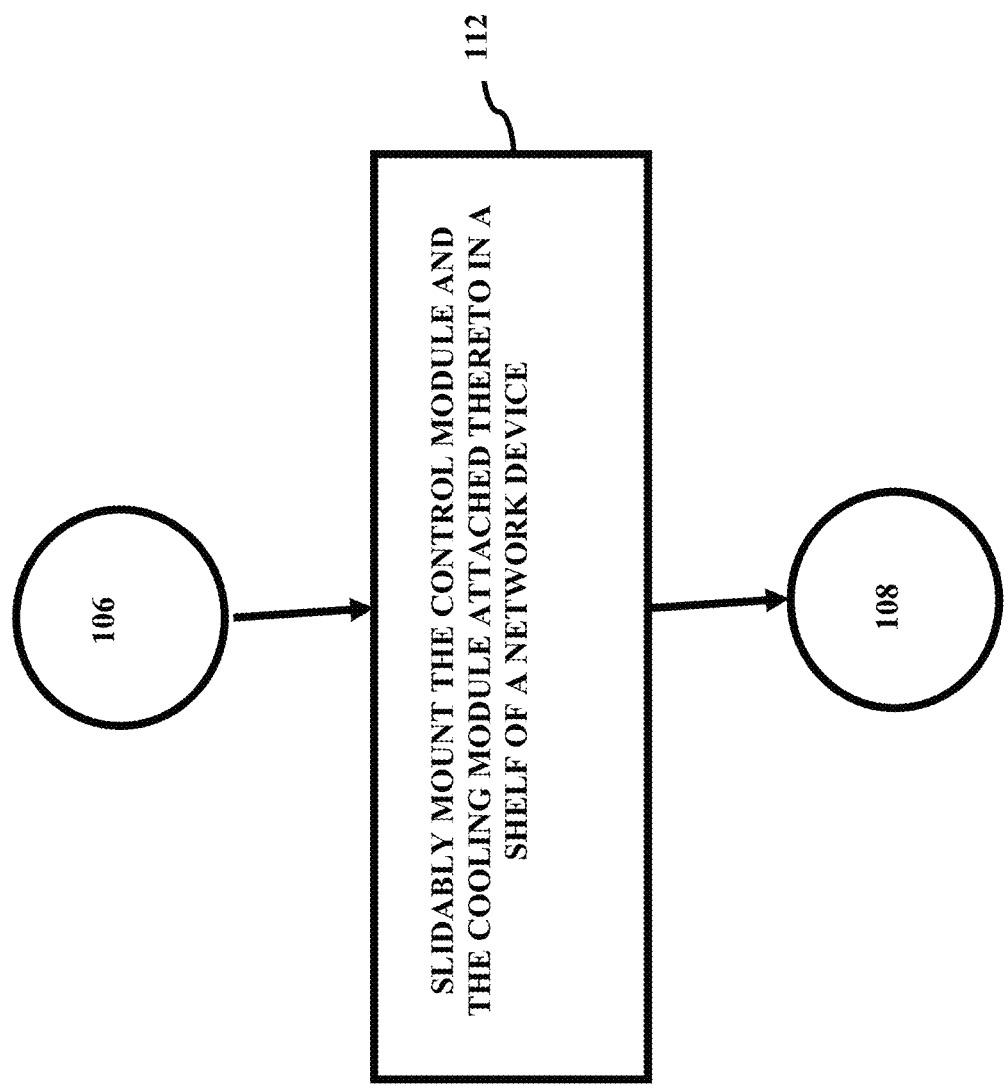

In various embodiments and referring additionally to FIG. 7C, if desired the method 100 may further include slidably mounting the control module and the cooling module attached thereto in a shelf of a network device at a block 112.

Figure 8A:
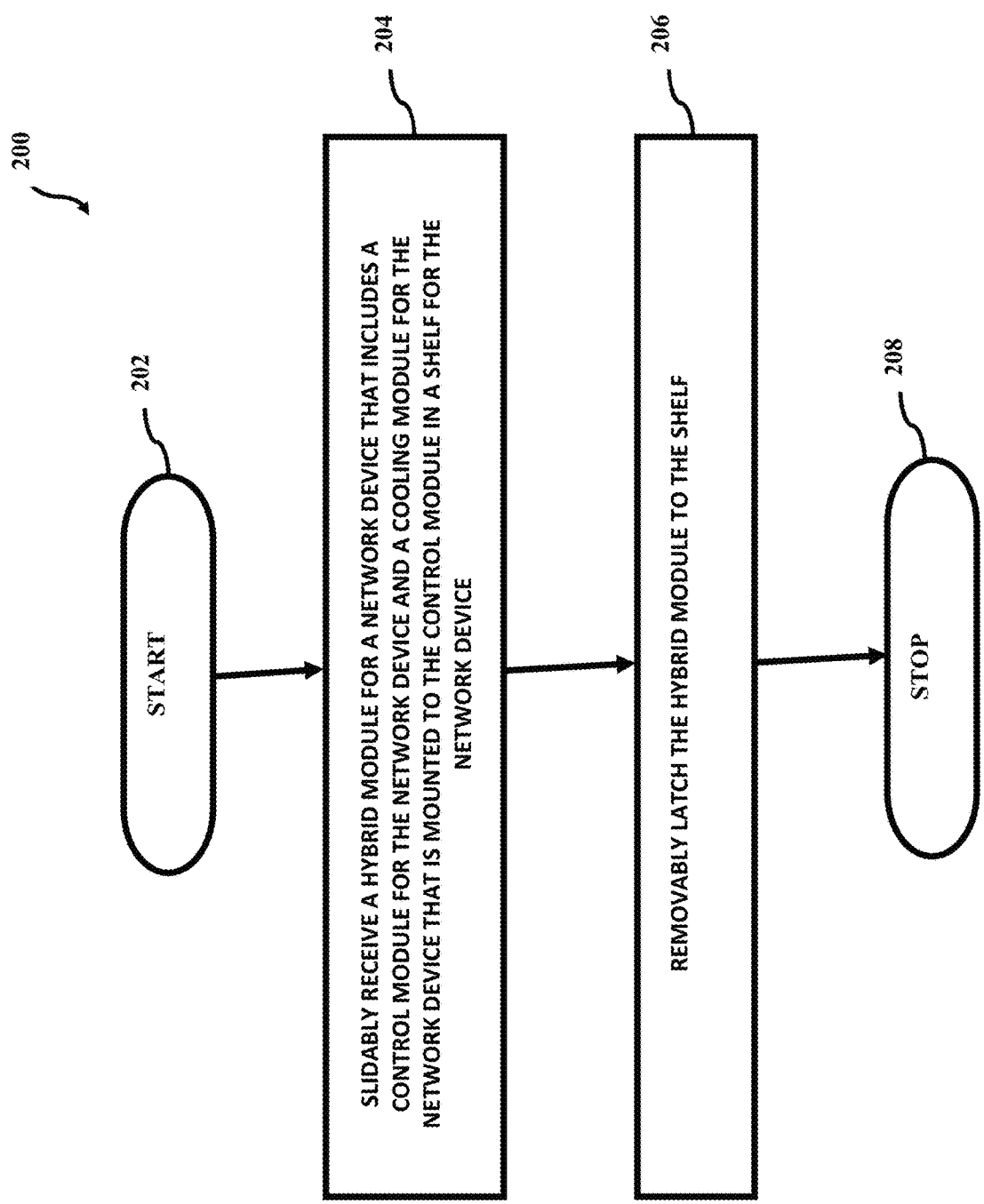
FIG. 8A is a flowchart of an illustrative method of slidably mounting a hybrid module for a network device in a shelf of the network device.

Referring now to FIG. 8A, an illustrative method 200 is provided for mounting a hybrid module for a network device. It will be appreciated that the method 100 may be well-suited for mounting the hybrid module 10, discussed above. The method 200 starts at a block 202. At a block 204 a hybrid module for a network device that includes a control module for the network device and a cooling module for the network device that is mounted to the control module is slidably received in a shelf for the network device. At a block 206 the hybrid module is removably latched to the shelf. The method 200 stops at a block 208.

It will be appreciated that some embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various embodiments.

Moreover, some embodiments may include a non-transitory computer-readable storage medium having computer readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A network device comprising:
a shelf configured to support interface cards on a front side thereof;
a control module including a first frame and a printed circuit board disposed to the first frame, wherein the control module is configured to connect on a rear side of the shelf and the first frame includes slots therein; and
a cooling module including a second frame, cooling fans disposed to the second frame, and mounting tabs, wherein the cooling module is configured to slidingly connect to the first frame on the rear side of the shelf via the mounting tabs being received in the slots.

2. The network device of claim 1, wherein the shelf is a 1-2 rack unit (RU) high integrated shelf.

3. The network device of claim 1, wherein the control module includes connectors configured to connect the printed circuit board to mid-plane connectors of the shelf.

4. The network device of claim 1, wherein the cooling module includes connectors configured to connect the cooling module to mid-plane connectors of the shelf.

5. The network device of claim 1, further comprising a fastening mechanism configured to removably attach the cooling module to the control module.

6. The network device of claim 1, wherein the control module and the cooling module are in-service replaceable.

7. The network device of claim 1, wherein the control module and the cooling module are independent modules with the first frame and the second frame configured to slide into one another.

8. The network device of claim 1, wherein the second frame has an L-shape that mates with the first frame.

9. A method comprising:
providing a network device including
a shelf configured to support interface cards on a front side thereof;
a control module including a first frame and a printed circuit board disposed to the first frame, wherein the control module is configured to connect on a rear side of the shelf and the first frame includes slots therein; and
a cooling module including a second frame, cooling fans disposed to the second frame, and mounting tabs, wherein the cooling module is configured to slidingly connect to the first frame on the rear side of the shelf via the mounting tabs being received in the slots.

10. The method of claim 9, wherein the shelf is a 1-2 rack unit (RU) high integrated shelf.

11. The method of claim 9, wherein the control module includes connectors configured to connect the printed circuit board to mid-plane connectors of the shelf.

12. The method of claim 9, wherein the cooling module includes connectors configured to connect the cooling module to mid-plane connectors of the shelf.

13. The method of claim 9, further comprising a fastening mechanism configured to removably attach the cooling module to the control module.

14. The method of claim 9, wherein the control module and the cooling module are in-service replaceable.

15. The method of claim 9, wherein the control module and the cooling module are independent modules with the first frame and the second frame configured to slide into one another.

16. The method of claim 9, wherein the second frame has an L-shape that mates with the first frame.

17. A network device comprising:
- a shelf configured to support interface cards on a front side thereof;
- a control module including a first frame and a printed circuit board disposed to the first frame, wherein the control module is configured to connect on a rear side of the shelf and the first frame includes slots therein; and
- a cooling module including a second frame, cooling fans disposed to the second frame, and mounting tabs, wherein the cooling module is configured to slidingly connect to the first frame on the rear side of the shelf via the mounting tabs being received in the slots,
- wherein the control module and the cooling module are independent modules with the first frame and the second frame configured to slide into one another.

18. The network device of claim 17, wherein the shelf is a 1-2 rack unit (RU) high integrated shelf.

* * * * *